United States Patent [19]

Walls et al.

[11] 4,448,873

[45] May 15, 1984

[54] NEGATIVE WORKING DIAZO CONTACT FILM

[75] Inventors: John E. Walls, Annandale; Major S. Dhillon, Hillsborough, both of N.J.

[73] Assignee: American Hoechst Corporation, Somerville, N.J.

[21] Appl. No.: 359,460

[22] Filed: Mar. 18, 1982

[51] Int. Cl.$^3$ .................... G03C 1/60; G03C 1/78
[52] U.S. Cl. ........................... 430/157; 430/5; 430/145; 430/175; 430/176; 430/292; 430/294
[58] Field of Search ............... 430/176, 175, 157, 144, 430/148, 5, 292, 294, 293, 145

[56] References Cited

U.S. PATENT DOCUMENTS

| | | |
|---|---|---|
| 1,997,507 | 3/1932 | Akintievsky . |
| 2,537,919 | 1/1951 | Slifkin . |
| 2,593,911 | 12/1948 | Neumann et al. . |
| 2,854,338 | 9/1958 | Herrick et al. . |
| 2,890,115 | 6/1959 | Süs et al. . |
| 3,174,860 | 3/1965 | Süs et al. . |
| 3,218,167 | 11/1965 | Burg et al. ........................ 430/253 |
| 3,622,325 | 11/1971 | Toshida . |
| 3,637,375 | 1/1972 | Levinos . |
| 3,661,579 | 5/1972 | Vrancken et al. . |
| 3,671,236 | 6/1972 | Van Beusekom ................. 430/175 |
| 3,689,268 | 9/1972 | Yoshida et al. . |
| 3,785,826 | 1/1974 | Slimowicz et al. . |
| 3,884,693 | 5/1975 | Bauer et al. ..................... 430/259 |
| 3,975,563 | 8/1976 | Franer et al. . |
| 4,186,017 | 1/1980 | Palmer ............................. 430/175 |
| 4,241,166 | 12/1980 | Klüpfel et al. . |
| 4,268,601 | 5/1981 | Namiki et al. . |
| 4,271,260 | 6/1981 | Abele et al. ..................... 430/292 |
| 4,299,906 | 11/1981 | Liu ................................... 430/175 |
| 4,337,307 | 6/1982 | Neubauer ......................... 430/175 |

FOREIGN PATENT DOCUMENTS 1313777 4/1973 United Kingdom .

*Primary Examiner*—Charles L. Bowers, Jr.
*Attorney, Agent, or Firm*—Richard S. Roberts; James R. Cartiglia

[57] ABSTRACT

A photographic element comprising a transparent support and a coating on the support comprising a diazonium composition having a light absorbency of about 45% or less, and a colorant composition, said coating having a light transmission of not more than about 0.1%.

10 Claims, No Drawings

NEGATIVE WORKING DIAZO CONTACT FILM

BACKGROUND OF THE INVENTION

The present invention relates to contact films, or more particularly to contact films which do not contain silver halide compounds as part of their light sensitive coating.

Conventionally, in the preparation of light sensitive lithographic printing plates, an image is imparted to such plate via contact exposure or projection through a photographic mask. Such a mask typically comprises a transparent support and a photosensitive composition on the transparent support. This photosensitive composition is typically exposed to an original image sought to be reproduced, and developed. The vast majority of such photomasks employ silver halide gelatin compositions on the support as the imaging agent. With the recent dramatic increases in the cost of silver and its reclamation, users of such films have desired a film having the benefits of silver halide films yet which do not contain silver. Although this has been a goal of the art and many substitutes have been proposed, these have not been satisfactory to those skilled in the art of printing plate manufacture and use. These proposals are based upon diazo-coupler or photopolymer systems as the means of creating a UV activated, developer differentiated imaging method. These systems have severe shortcomings in the areas of proper light transmission density, exposure speed, speed of development, developer properties and opacity to UV radiation after exposure and development. Such films therefore find their usefulness primarily as proofing or duplicating films and not as high density films which may be used to expose printing plates as they are aesthetically unsatisfactory due to their color and high transmission of visible light.

The present invention overcomes these problems to provide a photographic element which has sufficient light sensitivity to be exposable within a commercially feasible time; is developable with a fluid developer so as to quickly and completely remove the non-image areas; and possesses sufficient opacity in the non-removed areas so it will be useful to block sufficient ultraviolet radiation when used as a mask to further expose lithographic printing plates or other photographic elements.

SUMMARY OF THE INVENTION

The present invention provides a photographic element comprising a support and a coating on at least a portion of said support, said coating comprising a light sensitive negative working diazonium composition having a light absorbency of about 45% or less, and a colorant composition; said coating having a light transmission of not more than about 0.1% and is capable of being rendered substantially insoluble upon exposure to ultraviolet radiation at an energy level of from about 15 to about 25 mJ/cm$^2$. The thusly produced film employs dyes which allow sufficient UV penetration for exposure and image-background differentiation. However, after development, said images are sufficiently opaque to UV light so as to allow for the proper exposure of commercial printing plates, as well as duplicator films. In addition, the speed is approximately 25 mJ/cm$^2$ as opposed to 100-200 mJ/cm$^2$ for current state of the art products which use photopolymers and diazo couplers. Furthermore, development, unlike diazo-couplers which use NH$_4$OH vapor, is done with a fluid, such as an aqueous alkaline solution. Resolution is acceptable for both commercial and newspaper needs. Black films may be produced to closely resemble the silver halide films currently in use for these purposes.

DETAILED DESCRIPTION OF THE PREFERRED EMBODIMENT

In the production of the photographic element of the present invention, the support used is preferably transparent. Supports within the contemplation of this invention include aluminum, polyester, polystyrene, polyamide, polycarbonate, polypropylene, and cellulose acetate films, glass, metal coated transparent material and the like. Most preferably it is a polyester such as polyethylene terephthalate. Particularly suitable polyesters include Hostaphan 4500 (available from American Hoechst Corporation), Melinex 305 and 505 (ICI) and Mylar (DuPont).

Coated on this substrate is a photosensitive composition comprising at least one diazo compound, a binder resin composition and a colorant composition. Other useful ingredients include optional plasticizers, surfactants, flow and/or leveling agents, agents to improve developability, and other ingredients known to the skilled artisan as useful for the production of such photosensitive elements which do not appreciably detrimentally affect the light sensitivity and transmission of the element. Similarly non-detrimental solvent compositions are likewise employed to blend the above ingredients for application to the substrate.

In the production of the photosensitive coating composition of this invention, the colorant composition is extremely important for proper color and transmission density. For a film to be used for printing plate exposure, unlike a film to make duplicating films, a density of 2.0 is unacceptable. At 2.0 transmission density, 99.0% of the light is opaqued. The 1.0% passing through would cause background problems when used to expose a printing plate. What is required is a density of 3.0 or more where only 0.1% or less of the light is transmitted. A mixture of dyes is preferable so as to close the desired spectrum window in the UV region to approximately the 360-390 nanometer range.

A yellow, red and blue dye will, at the proper level, produce the desired effect. The most preferred dye composition comprises Calcozine Yellow, Rhodamine 6 GDN (Red) and Victoria Blue FGA. These are not intended to be all inclusive, but rather representative. Combinations of the following dyes are also preferred: auramine, acrydine yellow, methyl orange, naphthol green, methyl thymol blue, phenol red, Calcozine black CBF, basic black W-113 and pena dyes. The invention employs a colorant composition which includes a carbon black dispersion or a dye or mixture of dyes which has a light transmission of 0.1% or less in the 350 to 390 nanometer range.

The diazonium compositions which are most advantageously employed in accordance with the teachings of the present invention are those extremely light sensitive materials exhibiting an absorbtivity of 45% or less when exposed to a suitable energy source in the range from about 350 to about 390, preferably 360 to 380, nanometers using, for example, a Perkin-Elmer UV visible spectrophotometer (Model No. 559) under standard test conditions. The diazonium composition may comprise one or more diazonium compounds alone or with a selected speed accelerator. For use in the present invention, the test diazonium composition must pass the following test.

TEST PROCEDURE

Dissolve 0.001 gram of the test diazonium composition in 100 ml Methyl Cellosolve. First both cells of the spectrophotometer are filled with Methyl Cellosolve and the instrument is zeroed for Methyl Cellosolve at a 368 nanometer spectrum reading. The test solution then replaces Methyl Cellosolve in one of the cells and the solution is scanned for light absorbence. The test solution is acceptable if the absorbence is about 45% or less. Solvents other than Methyl Cellosolve may also be used if desired.

In the preferred embodiment, a light absorbence of from about 25% to about 40% is preferred. The preferred diazonium compounds for use in the present invention are condensation of 4,4'-Bis-methoxymethyl diphenyl ether with 3-methoxy-4-diazo diphenylamine sulfate isolated as the mesitylene sulfonate salt; and the reaction product of the homo-condensation product of 4,4'-Bis-methoxy methyl diphenyl ether with 3-methoxy-4-diazo diphenylamine sulfate, isolated as the mesitylene sulfonate. Preferred accelerators which may be used as part of the diazonium composition include substituted amine and azo compound accelerators, present in an amount sufficient to substantially improve the photosensitive speed of said diazonium compound. These include primary, secondary and tertiary aromatic substituted amines. Most preferred among these are diphenyl amine, triphenyl amine, 4-phenyl azo diphenyl amine, a-tolyl azo toluidine, t-butyldiethanol amine, and 1-methyl-2-(2'-hydroxyphenol) benzimidazole. Other useful accelerators include phenol, diphenol, substituted phenol and diphenol compounds which are capable of enhancing and in an amount which is sufficient to enhance the solubility differential between phenol and contact exposure negative-working diazonium compounds when such diazonium compounds are subjected to UV radiation. The most preferred examples of these are: phenol; resorcinol; catechol; phloroglucinol; pentaerythritol; p-p'-biphenol; 3-methoxyphenol; 3,3'-diethylene dioxy diphenol, 2,6-resorcylic acid; p-phenylazophenol; 4-(p-nitrophenylazo) resorcinol; and 4-bromo-3'5-resorcylic acid.

Additional useful accelerators include 1,1-thiobis-(2-naphthol)-diresorcinol sulfide; phenyl sulfone; phenathiazine; dibenzothiophene sulfone; N-(3-hydroxyphenyl)-2-hydroxy; 3-naphthamide; 2,3-dihydroxy naphthoic acid ethanolamide; N,N'-ethylene-bis-aceto acetamide; 4-bromo-3,5-resorcylic acid amide and the sulfur compounds, amide compounds and sulfur-amide compounds which are functional equivalents thereof, in an amount sufficient to substantially improve the photosensitive speed of said diazonium compounds.

These accelerators are more fully described in U.S. patent application Ser. Nos. 359,336, 359,337, both abandoned and 359,629, filed on even date herewith and which are incorporated herein by reference.

Also preferably included in the coating of the present invention is a binder resin. The binder resin assists in providing a solid and stable matrix that will withstand handling and provide a firm adhesion to the substrate. It should preferably have acid functionality to allow for removal in an aqueous alkaline solution. The preferred binder resin is a copolymer of styrene and maleic anhydride. Other examples are polymethylmethacrylate/methacrylic acid copolymer, copolymer of methyl vinyl ether and maleic anhydride, styrene and methacrylic acid copolymer and polymethacrylic acid and acrylic acid copolymer.

The coating may optionally contain a gum. The gum assists in the flow and leveling of the coating and in the elimination of certain coating imperfections. A preferred gum is hydroxy isopropyl cellulose. Other gums include methyl cellulose, hydroxy ethyl cellulose, carboxy methyl hydroxy ethyl cellulose, polyvinyl alcohol, polyvinyl pyrrolidone and copolymer of polyvinyl alcohol/polyvinyl acetate.

The coating may optionally include plasticizers which reduces brittleness and imparts more flexibility to the film. Suitable plasticizers include dimethyl phthalate, dibutyl phthalate and dioctyl phthalate.

The coating may also contain organic acids as stabilizers which aid developability and enhance shelf life. These include aryl sulfonic and disulfonic acids. Examples include p-toluene sulfonic acid, benzene sulfonic acid, mesitylene sulfonic acid, naphthalene sulfonic acid, citric acid, tartaric acid, and phosphoric acid.

The coating composition is formed by employing a suitable combination of solvents which will dissolve the foregoing ingredients into a useful composition. After coating the formed composition onto the substrate, these solvents are substantially dried. Solvents for one or more of the foregoing components include water, such alcohols as ethanol, methanol, n-propanol and isopropanol; ethers such as 2-methoxy ethanol, 2-methoxy ethyl acetate, 2-ethoxy ethanol, 2-ethoxy ethyl acetate, and 2-butoxy ethanol; and such ketones as methyl ethyl ketone, diethyl ketone, methyl isobutyl ketone, diisobutyl ketone; diisopropyl ketone and methyl isopropyl ketone.

In the formation of the coating compositions of the present invention, the following non-limiting ingredient amounts may be used. All amounts are in weight percent of the solid dried coating.

| Ingredient | Preferred Range | More Preferred Range | Most Preferred Range |
| --- | --- | --- | --- |
| Diazo | 1.0–60.0 | 15.0–50.0 | 25.0–45.0 |
| Binder resin | 1.0–35.0 | 5.0–25.0 | 10.0–25.0 |
| Colorant composition | .3–40.0 | 2.5–40.0 | 10.0–30.0 |

The following optional ingredients have the indicated ranges when used in the coating composition.

| Ingredient | Preferred Range | More Preferred Range | Most Preferred Range |
| --- | --- | --- | --- |
| Stabilizer | .05–15.0 | 0.1–10.0 | 1.0–5.0 |
| Speed accelerator | .05–15.0 | 0.1–10.0 | 1.0–5.0 |
| Gum | .001–15.0 | 0.1–10.0 | .50–5.0 |

The following non-limiting examples illustrate the invention.

EXAMPLE 1

A 18"×18" sample of a transparent polyester film base, sold by American Hoechst Corporation of Somerville, N.J., under the trade name of HOSTAPHAN, is whirler coated with the following coating solution:

| | %(W/W) |
|---|---|
| 2-Methoxy ethanol | 26.3 |
| Methyl ethyl ketone | 34.4 |
| Ethanol (anhydrous) | 25.5 |
| Dimethyl phthalate | 0.4 |
| p-toluene sulfonic acid | 0.3 |
| Styrene-maleic anhydride copolymer | 1.9 |
| Hydroxy isopropyl cellulose | 0.0 |
| Calcozine yellow | 1.6 |
| Rhodamine 6 GDN | 0.6 |
| Victoria blue FGA | 0.6 |
| Diazo | 8.0 |

The diazonium compound is the reaction product of the homo condensation product of 4,4'-Bis methoxy methyl diphenyl ether with 3-methoxy-4-diazo diphenyl amine sulfate, isolated as mesitylene sulfonate salt.

The coated film is baked for two minutes at 100° C. to drive off the residual solvents. The coated film is then exposed with a mercury vapor light source using a test flat and through a 21 step Stauffer Step Wedge (emulsion to emulsion), with each increasing step representing a change in density equal to the square root of 2. The test film is exposed with 4 units of light (1 unit=10 mJ/cm$^2$). The exposed film is developed with an aqueous alkaline developer containing metal salts of phosphoric acid and salicic acid. The developed film is found to have 2 solid and 2 ghost steps in addition to having a fully desensitized non-image area.

EXAMPLE 2

Example 1 was repeated except the diazonium compound employed is the product of the condensation of 4,4'-Bismethoxy methyl diphenyl ether with 3-methoxy-4-diazo diphenylamine sulfate isolated as mesitylene sulfonate. This diazonium compound and analogous diazonium compounds are disclosed in U.S. Pat. No. 3,849,392.

The coated film is processed in the same manner as described in Example 1 and is found to have 1 solid and 2 ghost steps.

EXAMPLE 3

Example 1 is repeated except the diazonium compound used is the product of the condensation of p-diazo diphenylamine sulfate and paraformaldehyde, isolated as the hexafluorophosphate. This diazonium compound is sold by MRI, Hightstown, N.J. under the trade mark of 'Diazo BBP'.

The coated film is processed in the same manner as described in Example 1 and is found to have no solid and 1 ghost step. The resulting image is not considered to be commercially acceptable.

EXAMPLE 4

Example 2 is repeated except 5.0 grams of the diazo is employed to make the coating solution. The coated film is processed in the same manner as described in Example 1. The processed film is found to have 1 solid and 1 ghost step.

EXAMPLE 5

The Example 1 is repeated except the binder resin employed is polymethylmethacrylate/methacrylic acid copolymer. The coated film is processed in the same manner as detailed in Example 1. The film upon processing gives 2 solid and 2 ghost steps.

EXAMPLE 6

The Example 2 is repeated except 1.0 grams of Morfast black 101 dye (a black cobalt azo dye by Morton Chemical Co., Chicago, Ill.) is used instead of the calozine yellow, Rhodamine 6 GDN and Victoria blue FGA dyes. The coated film upon processing according to the method of Example 1 gives 2 solid and 2 ghost steps.

EXAMPLE 7

Example 2 is repeated except in this case 5.0 grams of Morfast black 101 dye is added to the coating solution. The solution is whirler coated onto a polyester film support. The coated film is processed according to the method of Example 1. The processed film gives 1 solid and 4 ghost steps.

EXAMPLE 8

The Example 1 is repeated except in this case the yellow dye used is acrydine yellow. The coated film, upon processing according to the method of Example 1, gives 2 solid and 2 ghost steps.

EXAMPLE 9

The Example 2 is repeated except auramine dye is used in place of calcozine yellow. The coated film upon processing, according to the method described in Example 1, gives 1 solid and 2 ghost steps.

EXAMPLE 10

50.0 grams of coating solution from Example 1 is diluted to 100.0 grams with 2-methoxy ethanol. A polyester film support is whirler coated with this solution. The coated film upon processing, according to the method of Example 1, gives 2 solid and 1 ghost steps.

The transmission densities of the coated films of Examples 1–10 are measured with a Gretag D-3 Transmission Densitometer employing black, blue, red and green filters. The transmission densities are given below:

| EXAMPLE/FILM | TRANSMISSION DENSITY FILTER | | | |
|---|---|---|---|---|
| | BLACK | BLUE | GREEN | RED |
| Film 1 | 3.20 | 3.87 | 4.10 | 2.80 |
| Film 2 | 3.20 | 3.87 | 4.10 | 2.80 |
| Film 3 | — | — | — | — |
| Film 4 | 1.14 | 1.88 | 1.65 | 1.01 |
| Film 5 | 3.20 | 3.80 | 4.15 | 2.85 |
| Film 6 | 1.75 | 1.82 | 1.65 | 1.55 |
| Film 7 | 3.35 | 3.96 | 4.20 | 2.85 |
| Film 8 | 3.20 | 3.85 | 4.10 | 2.80 |
| Film 9 | 3.15 | 3.75 | 4.10 | 2.75 |
| Film 10 | 1.80 | 2.75 | 2.65 | 1.60 |

Examples 1, 2, 5, 7, 8 and 9 exemplify a product exhibiting the sought after characteristics of the invention. Example 3 uses a diazonium compound having a high absorbence falling outside the established maximum. The resulting film is sufficiently slow in response to light that no image is observed after exposure. Example 4 illustrates the need for an ample amount of diazo compound. In this instance, a reduction of 37.5% of the amount of diazo as compared to Example 2 results in a film having unacceptable density. Example 6 uses a single dye as contrasted to the three dye system of the previous examples and thereby results in a film product having a too low density. In contrast, Example 7 uses the same dye but with a five fold increase. In this instance, acceptable speed is still retained while also possessing the desired density. Example 10 depicts the use of Example 1 but with a reduction by 50% of the solids through dilution. Such a film is not acceptable because of an inadequate density.

Example 1 used a high speed diazo compound which is similar to Example 2 where a slower diazo is used. Both have acceptable density although there is a slight variation in step-wedge. Examples 8 and 9 are the same as 1 and 2 except an alternative but useful dye system is employed. Example 5 displays the same good results as Example 1 while using an alternative binder resin.

What is claimed is:

1. A photographic element capable of functioning as a photomask upon imagewise exposure to a suitable light source and upon development by a suitable developer, comprising a transparent support and a coating on at least a portion of said support, said coating comprising a light sensitive negative working diazonium composition having a light absorbency of about 45% or less when exposed to a suitable energy source in the range from about 350 to about 390 nanometers as determined by the herein specified Test Procedure, and a colorant composition comprising a mixture of dyes, said coating having a light transmission of not more than about 0.1% in the 350 to 390 nanometer range, and is capable of being rendered substantially insoluble upon exposure to ultraviolet radiation at an energy level of from about 15 to about 25 mJ/cm$^2$ and wherein the non-image areas are substantially removable upon treatment with a suitable developer.

2. The element of claim 1 wherein said diazonium composition comprises the product of condensation of 4,4′-Bis-methoxymethyl diphenyl ether with 3-methoxy 4-diazo diphenylamine sulfate isolated as the mesitylene sulfonate.

3. The element of claim 1 wherein said diazonium composition comprises the reaction product of the homo-condensation product of 4,4′-Bis-methoxy methyl diphenyl ether with 3-methoxy-4-diazo diphenyl amine sulfate, isolated as the mesitylene sulfonate.

4. The element of claim 1 wherein said coating further comprises one or more binder resins selected from the group consisting of a copolymer of styrene and maleic anhydride, polymethylmethacrylate/methacrylic acid copolymer, copolymer of methyl vinyl ether and maleic anhydride, styrene and methacrylic acid copolymer, and poly methacrylic acid and acrylic acid copolymer.

5. The element of claim 1 wherein said coating further comprises one or more gums selected from the group consisting of hydroxy isopropyl cellulose, methyl cellulose, hydroxy ethyl cellulose, carboxy methyl hydroxy ethyl cellulose, polyvinyl alcohol, polyvinyl pyrrolidone and copolymer of polyvinyl alcohol/polyvinyl acetate.

6. The element of claim 1 wherein said coating further comprises one or more plasticizers selected from the group consisting of dimethyl phthalate, dibutyl phthalate and dioctyl phthalate.

7. The element of claim 1 wherein said coating further comprises one or more organic sulfonic or disulfonic acids.

8. The element of claim 7 wherein said acid is selected from the group consisting of p-toluene sulfonic acid, benzene sulfonic acid, mesitylene sulfonic acid and naphthalene sulfonic acid.

9. The element of claim 1 wherein said coating comprises one or more additional ingredients selected from the group consisting of binder resins, gums, organic acids and plasticizers.

10. The element of claim 1 wherein said transparent support comprises a material selected from the group consisting of polyester, polystyrene, polyamide, polycarbonate, polypropylene, cellulose acetate films, and glass.

* * * * *